(12) United States Patent
Rust

(10) Patent No.: US 9,820,415 B1
(45) Date of Patent: Nov. 14, 2017

(54) ELECTROMAGNETIC SHIELD DOOR SYSTEM

(71) Applicant: Stephen Vincent Rust, Ringwood, NJ (US)

(72) Inventor: Stephen Vincent Rust, Ringwood, NJ (US)

( * ) Notice: Subject to any disclaimer, the term of this patent is extended or adjusted under 35 U.S.C. 154(b) by 0 days.

(21) Appl. No.: 15/362,894

(22) Filed: Nov. 29, 2016

(51) Int. Cl.
| | |
|---|---|
| *H05K 9/00* | (2006.01) |
| *E06B 7/16* | (2006.01) |
| *E06B 7/28* | (2006.01) |
| *H02B 1/38* | (2006.01) |

(52) U.S. Cl.
CPC ............. *H05K 9/0007* (2013.01); *E06B 7/16* (2013.01); *E06B 7/28* (2013.01); *H02B 1/38* (2013.01); *H05K 9/0001* (2013.01); *H05K 9/0016* (2013.01)

(58) Field of Classification Search
CPC ...... E06B 5/18; H05K 9/0001; H05K 9/0016; H01B 1/38
See application file for complete search history.

(56) References Cited

U.S. PATENT DOCUMENTS

| | | | | | |
|---|---|---|---|---|---|
| 4,371,175 | A | * | 2/1983 | Van Dyk, Jr. | ......... E06B 7/2318 174/357 |
| 4,746,765 | A | * | 5/1988 | Mallott | ................ H05K 9/0015 174/368 |
| 5,847,316 | A | * | 12/1998 | Takada | ................ H05K 9/0001 174/374 |
| 6,170,203 | B1 | * | 1/2001 | Schlapfer | ............. E05F 17/002 174/353 |
| 8,925,251 | B1 | * | 1/2015 | Rust | .......................... E06B 7/18 49/401 |
| 2004/0129438 | A1 | * | 7/2004 | Christou | .............. H05K 9/0015 174/382 |
| 2007/0007037 | A1 | * | 1/2007 | Diaferia | ............... H05K 9/0015 174/382 |
| 2007/0095570 | A1 | * | 5/2007 | Roberts, IV | ......... H05K 9/0001 174/543 |
| 2008/0006443 | A1 | * | 1/2008 | Noda | ........................ E06B 5/18 174/377 |
| 2010/0096180 | A1 | * | 4/2010 | Carducci | .............. H05K 9/0001 174/364 |

* cited by examiner

Primary Examiner — Hung V Ngo

(57) ABSTRACT

A radio frequency shield door system is provided. The radio frequency shield door system provides an effective RF and electromagnetic seal between a door and the perimeter of the doorway through a continuous interface of conductive or magnetic material between peripheral sealing surface of the door and a perimeter frame of the doorway. The perimeter frame may provide spring-loaded contact rails electrically or magnetically coupled thereto so that when the door is in a closed configuration a RF seal is formed between the interfacing sealing surface and contract rails, yet the door is still readably between an open configuration and closed configuration.

13 Claims, 4 Drawing Sheets

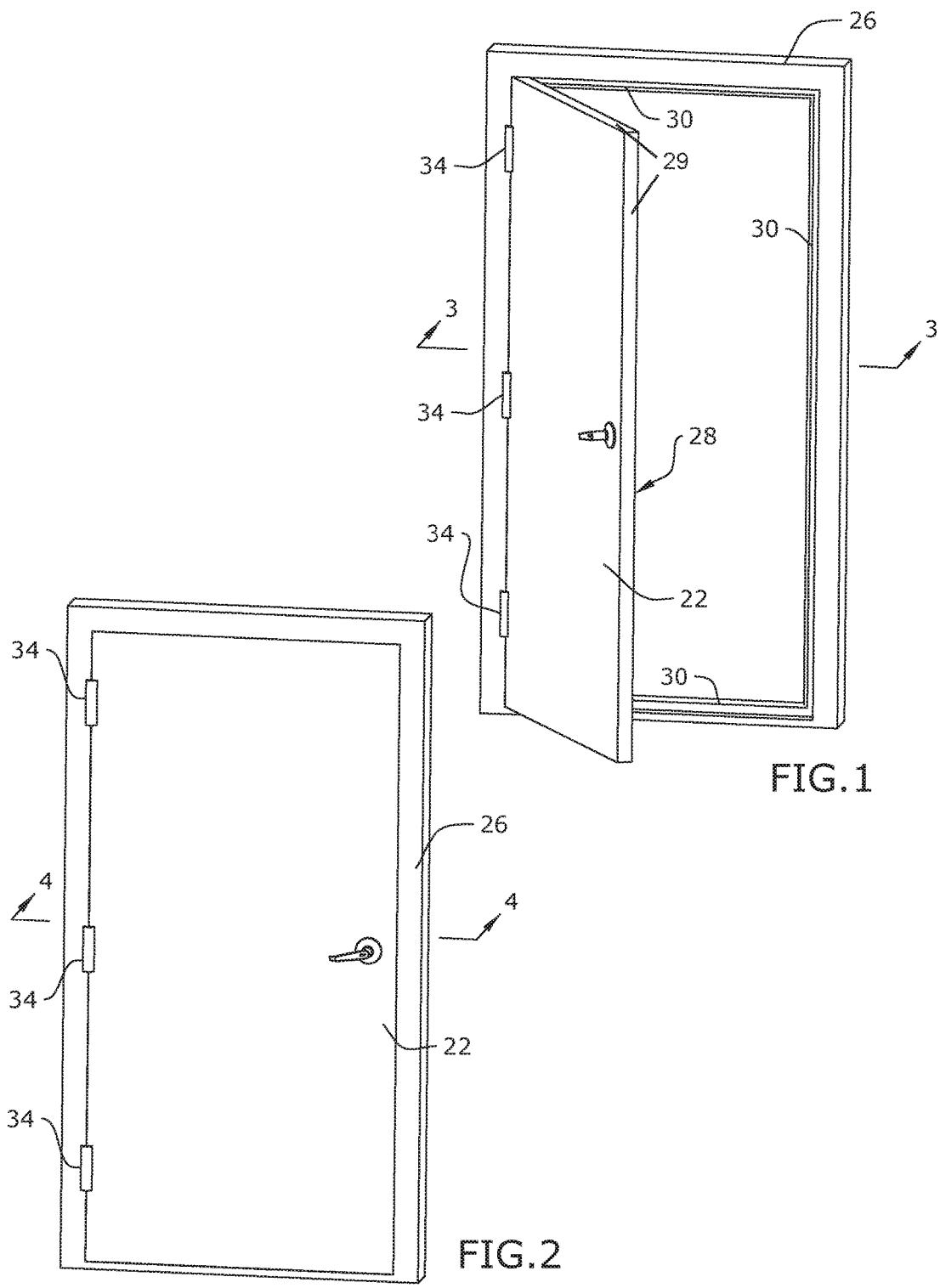

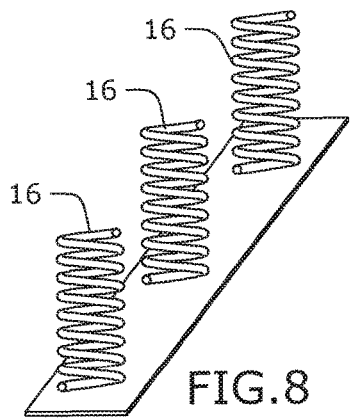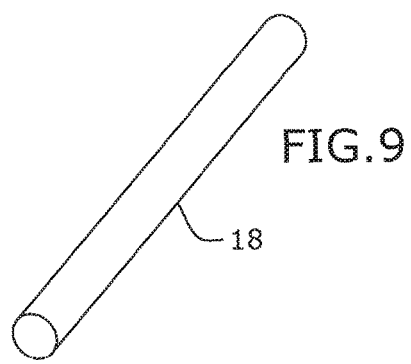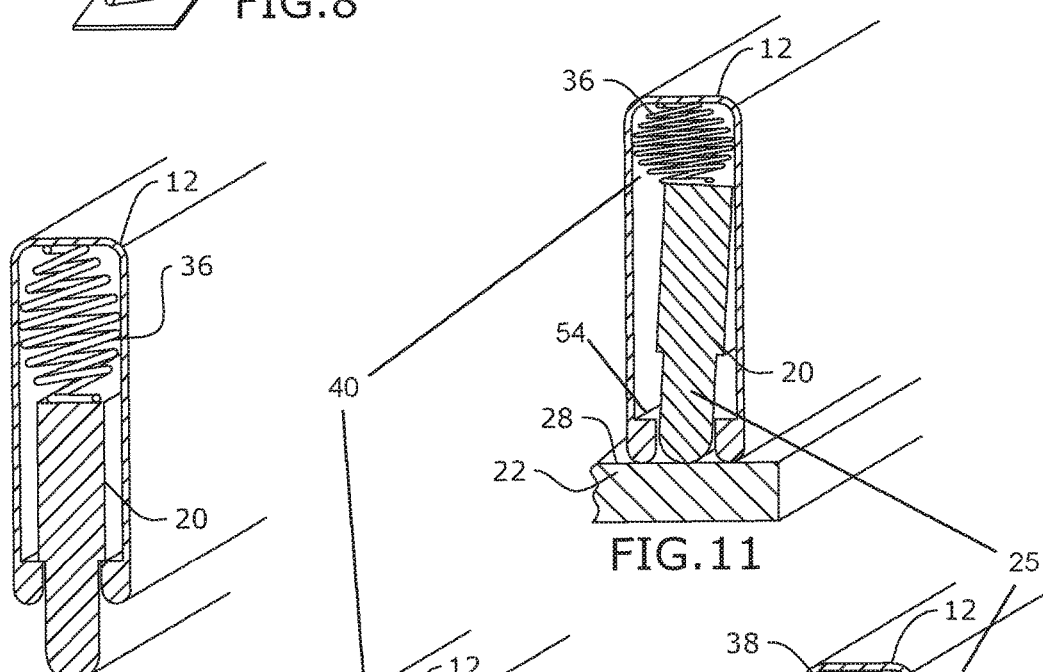

ELECTROMAGNETIC SHIELD DOOR SYSTEM

BACKGROUND OF THE INVENTION

The present invention relates to radio frequency shielding and, more particularly, to a radio frequency shield door system for blocking radio frequency electromagnetic radiation through a doorway to a livable space or shield room.

Electromagnetic shielding is the practice of reducing the electromagnetic field in a space or enclosure by blocking the field with barriers made of conductive or magnetic materials. Electromagnetic shielding that blocks radio frequency electromagnetic radiation is also known as RF shielding. The amount of reduction depends very much upon the material used (typically sheet metal or metal screens), its thickness, the size of the shielded volume and the frequency of the fields of interest and the size, shape and orientation of apertures in the shield to an incident electromagnetic field. Any holes in the shield or mesh must be significantly smaller than the wavelength of the radiation that is being kept out, or the enclosure will not effectively reduce the radio frequency electromagnetic radiation.

This necessity for minimizing holes, apertures and gaps between the RF shielding door and the doorway, has resulted in complicated sealing mechanisms and RF shield doors to date that are notoriously difficult to open and close. For example, typical spring finger contact mechanisms used in current RF shielded doors create a large amount of resistance in opening and closing the door as the springs exert a lateral force on a knife edge or sealing surface of a door which requires a great amount of energy to overcome. This in turn requires the use of large handles, cam blocks, pivot points, rollers, linkages, and other wear items to overcome/exert the necessary force to open and close the door. As a corollary, these complicated mechanisms have many potential failure points, wherein failures can render the door inoperable. This poses a safety concern since personnel may become trapped in a shield room.

Alternative methods for sealing off a doorway include complicated mechanisms such as air bladders or pneumatically assisted door latches. These solutions require frequent maintenance and repairs, and their complications also invite failure.

As can be seen, there is a need for a radio frequency shield door system for complete and effective RF and electromagnetic shielding through a doorway to a livable space or shield room by providing an RF door seal which takes minimal force to open and close.

SUMMARY OF THE INVENTION

In one aspect of the present invention, a system for providing electromagnetic shielding along a perimeter frame includes an access panel pivotally connected to the perimeter frame so as to be movable between an open configuration and a closed configuration electromagnetically sealing a periphery of the perimeter frame; and at least one contact rail connected along the periphery of the perimeter frame so as to be biased in an expanded condition and movable between the expanded condition and a compressed condition, wherein the at least one contact rail and the access panel comprise electrically conductive or magnetic material.

In another aspect of the present invention, the system for providing electromagnetic shielding along a perimeter frame includes an access panel pivotally connected to the perimeter frame so as to be movable between an open configuration and a closed configuration electromagnetically sealing a periphery of the perimeter frame; at least one retaining member connected along the periphery of the perimeter frame, each retaining member extending from a first end and a second end of electrically conductive or magnetic material, wherein each retaining member providing: a cavity between the first end and the second end; at least one opening in the second end communicating to the cavity; at least one contact rail, wherein each contact rail extends from a first portion to a second portion; and a biasing mechanism housed in each cavity, wherein the biasing mechanism engages the first portion so as to urge the second portion to protrude through an adjacent opening of the at least one opening in the expanded condition and be movable between the expanded condition and a compressed condition; and a sealing surface of electrically conductive or magnetic material provided along and inward of a periphery of the access panel so as to align with the at least one opening in the closed configuration. In further embodiments, including a groove for receiving a distal portion of each second portion, wherein each groove is provided along the sealing surface, and including a bias rod interconnecting the biasing mechanism and the first portion within each cavity, wherein each first portion provides an angled distal surface for engaging the respective bias rod, and wherein the at least one contact rail comprises two contact rails per cavity, and wherein the respective angled distal surfaces of said two contact rails are in a mirror orientation relative to each other.

These and other features, aspects and advantages of the present invention will become better understood with reference to the following drawings, description and claims.

BRIEF DESCRIPTION OF THE DRAWINGS

FIG. 1 is a perspective view of an exemplary embodiment of the present invention, with a door in an open configuration;

FIG. 2 is a perspective view of an exemplary embodiment of the present invention, with the door in a closed configuration;

FIG. 8 is a perspective view of an exemplary embodiment of a biasing mechanism of the present invention;

FIG. 9 is a perspective view of an exemplary embodiment of a bias rod mechanism of the present invention;

FIG. 10 is a detailed section view of an exemplary embodiment of the present invention in an expanded state;

FIG. 11 is a detailed section view of an exemplary embodiment of the present invention in a compressed state;

FIG. 12 is a detailed section view of an exemplary embodiment of the present invention in the expanded state; and FIG. 13 is a detailed section view of an exemplary embodiment of the present invention in the compressed state.

DETAILED DESCRIPTION OF THE INVENTION

Figure 3:
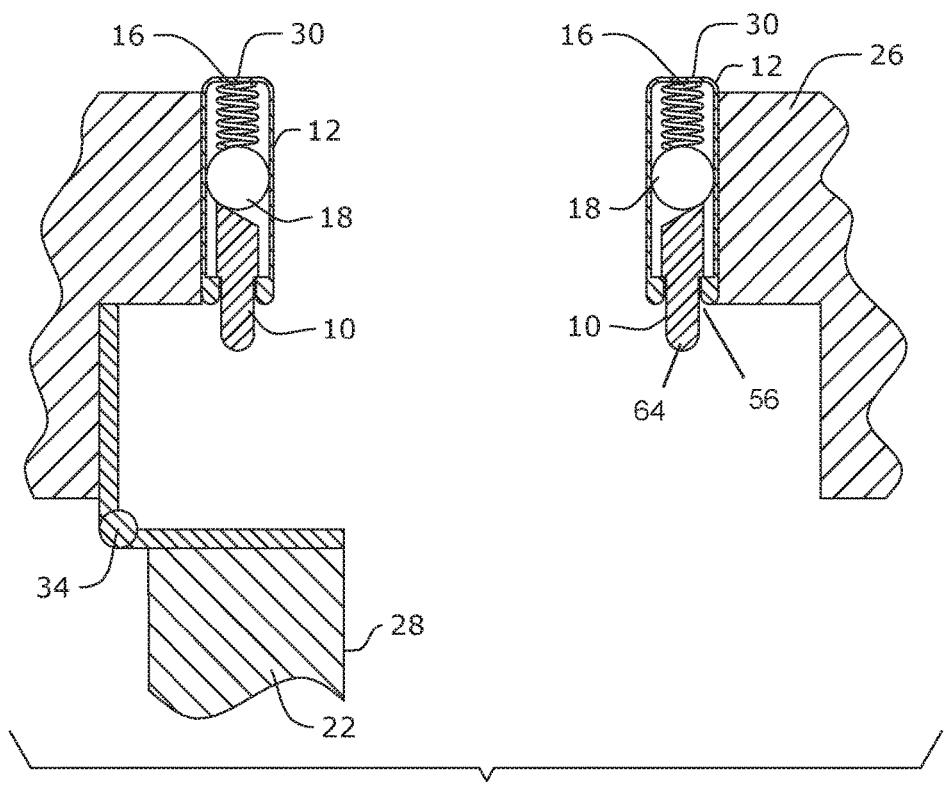
FIG. 3 is a section view of an exemplary embodiment of the present invention, taken along line 3-3 of FIG. 1.

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Broadly, an embodiment of the present invention provides a radio frequency shield door system for providing an effective RF and electromagnetic seal between a door and the perimeter of the doorway through a continuous interface of conductive or magnetic material between peripheral sealing surface of the door and a perimeter frame of the doorway. The perimeter frame may provide spring-loaded contact rails electrically or magnetically coupled thereto so that when the door is in a closed configuration a RF seal is formed between the interfacing sealing surface and contract rails, yet the door is still readably between an open configuration and closed configuration, and thus virtually maintenance free.

Referring to FIGS. 1 through 13, the present invention may include a radio frequency shield door system 100. An existing or new electromagnetic or RF shielded enclosure or shield room will have an opening or doorway for a door or access panel 22 to removably cover. The access panel 22 will be made from suitable electromagnetic shielding material(s) so as to provide a sealing surface 28. The sealing surface 28 may be on only one side of the access panel 22 (the side of the access panel 22 in a closed configuration that faces the enclosure—i.e., the immediate barrier to the sealed room). In certain embodiments, the sealing surface 28 may not even extend to a periphery 29 of the access panel 22, but rather be inward thereof. In other embodiments, the sealing surface 28 and the periphery 29 may be the same or shared. The opening may be defined by a door jam or perimeter frame 26 that contains or is connected rail retaining members 15. This retaining member 15 may be dimensioned and adapted to house a contact rail 25 and a biasing mechanism 40. The access panel 22 and the peripheral frame 26 may be interconnected by a door hinge or a pivotal connection 34 so that the access panel 22 may be movable between an open configuration and closed configuration, as illustrated in FIGS. 1 and 2, respectively. In the closed configuration the sealing surface 28 interfaces with the contact rail 25, forming an electromagnetic seal there between.

The contact rail 25 may be urged against the sealing surface 28 via the biasing mechanism 40, housed by the retaining member 15. This retaining member 15 may include a single rail version 30 having a single contact rail 25, a double rail 32 version having two contact rails 25, and the like. The retaining member 15 may provide an elongated housing member 12 or 14 that extends between a first end 52 and a second end 54 throughout its length. Between the first and second ends 52 and 54 is a cavity for housing the contact rail(s) 25 and the biasing mechanism 40. The biasing mechanism 40 may be disposed near the first end portion of the cavity while the contact rail(s) may be disposed near the second end portion of the cavity. The second end 54 may provide at least one opening 56 communicating to the cavity, wherein there is an opening 56 for each housed contact rail 25. Each contact rail 15 may extend from a first portion 62 to a second portion 64, wherein the second portion 64 is dimensioned and adapted to be movable between a compressed condition and an expanded condition. In the expanded condition, the second portion 64 snugly protrudes through an associated opening 56, and in the compressed condition is either flush with a periphery of the opening 56 or protrudes less than the expanded condition, whereby a periphery of the second portion 54 interfaces with the periphery of the opening 56 in either the compressed or expanded condition.

Figure 4:
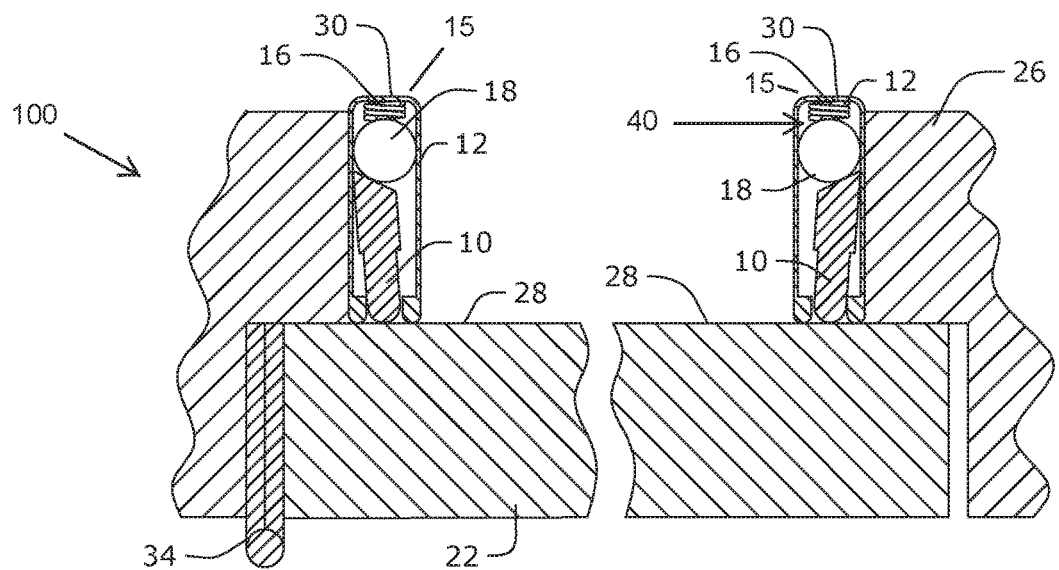
FIG. 4 is a section view of an exemplary embodiment of the present invention, taken along line 4-4 of FIG. 2.
Figure 5:
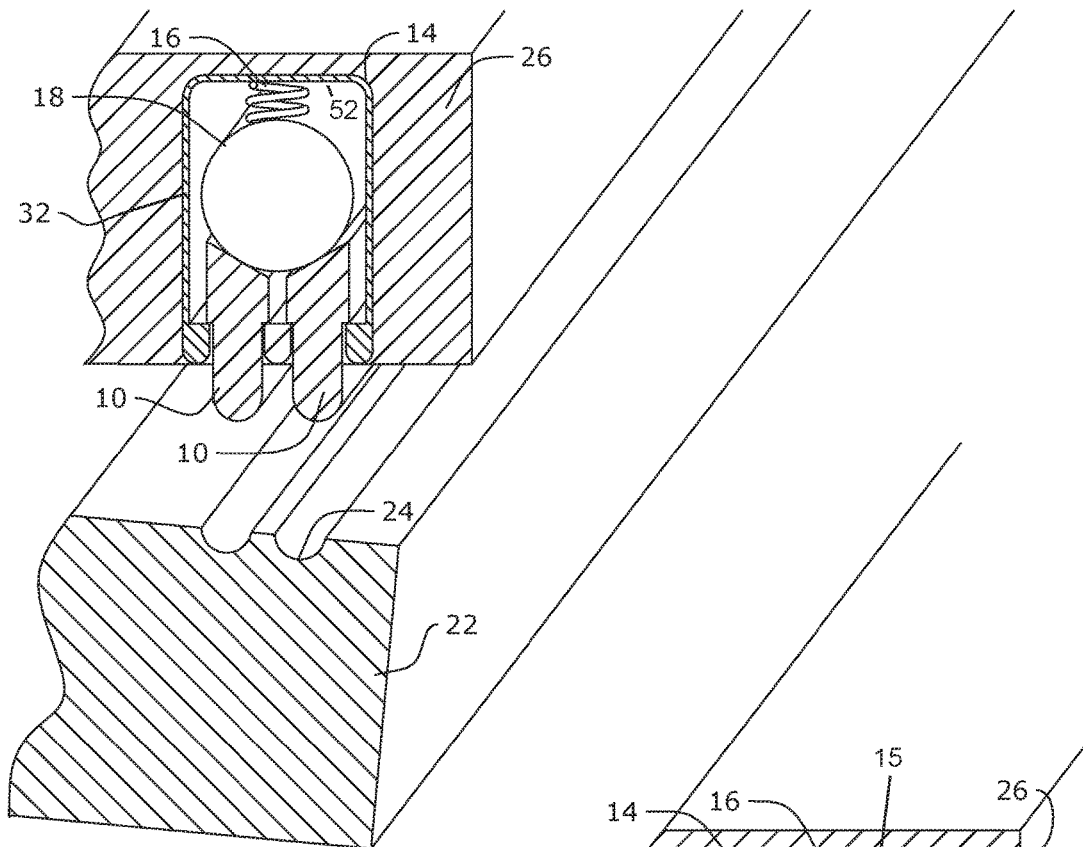
FIG. 5 is a detailed section view of an exemplary embodiment of the present invention with the door in the open configuration.
Figure 7:
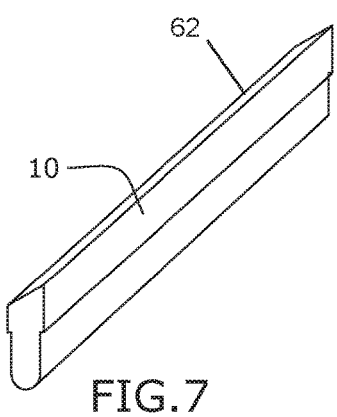
FIG. 7 is a perspective view of an exemplary embodiment of a contact rail of the present invention.

The first portion 62 of the contact rail may have an angled distal surface 10 or a straight distal surface 20, whereby the distal surface 10 or 20 engages the biasing mechanism 40. The biasing mechanism 40 may include a compression spring 16 between the first end 52 and a bias rod 18, whereby the bias rod 18 engages the first portion 62 of an associated contact rail 25 having an angled distal surface 10, as illustrated in FIGS. 3-6. In other embodiments, the biasing mechanism 40 may include a finger stock spring mechanism (and no bias rod 18) engaging the angled distal surface 10, as illustrated in FIGS. 12 and 13. In alternative embodiments, the biasing mechanism 40 may provide a tapered spring mechanism 36 that engages the straight distal surface 20, as illustrated in FIGS. 10 and 11. In all such embodiments, the biasing mechanism 40 urges the contact rail(s) 25 toward the expanded condition. In the closed configuration, the access panel 22 forces the contact rails 25 into the compressed condition, as illustrated in FIG. 4, while in the open configuration, the contact rails 25 are in the expanded condition, as illustrated in FIG. 3. In certain embodiments, the biasing mechanism 40 may force the contact rail laterally is to ensure that the contact rail makes intimate metal-to-metal contact with the inside surface of the retaining member. That is, it ensures that no RF/electromagnetic energy can find a path around the contact rail.

The angled distal surfaces 10 of two contact rails 25 may be engaged by opposing sides of the bias rod 18 so that when moving from the expanded condition to the compressed condition the bias rod 18 in effect "rolls" down the angled distal surfaces 10 from most distal to least distal portion thereof, forcing each contact rail 25 laterally, further ensuring an operable interface between the periphery of the contact rail(s) 25 and the periphery of the opening.

The biasing mechanism 40 may include a series of springs, as illustrated in FIG. 8, or one continuous spring along the length of its retaining member 15. The springs used by the biasing mechanism 40 may include coil springs, leaf springs, wavy springs formed from metallic piano wire, spring steel, stainless steel, beryllium copper, phosphor bronze, or other suitable material. The biasing mechanism 40 may be a conductive elastomer.

Figure 6:
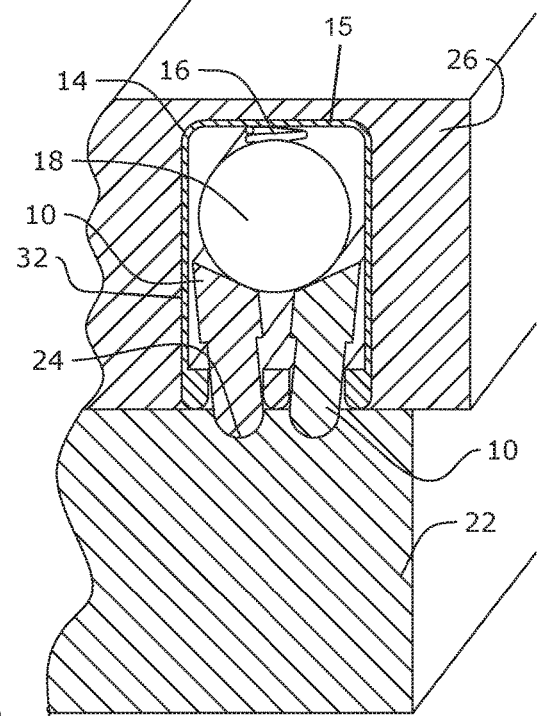
FIG. 6 is a detailed section view of an exemplary embodiment of the present invention with the door in the closed configuration.

The sealing surface 28 may provide a groove 24 adapted for receive the second portion 64 of each respective contact rail 25 when the access panel 22 is in the closed configuration, as illustrated in FIG. 6. As a result, the contact rail (s) 25 in the compressed condition may still protrude from its respective opening 56. The distal end of the second portion 64 can be concave, convex, textured, flat, serrated, etc. to increase the contact area between the contact rail 25 and the sealing surface 28. Each groove 24 may have a contour that matches the distal end of the second portion 64 to increase the surface area of conductive/magnetic material to conductive/magnetic material, thereby providing a RF seal between the access panel 22 and the perimeter frame 26 via the contact rails 25 and the retaining member(s) 15 all of which are made of electrically conductive or magnetic material such as brass, bronze, copper, steel, stainless steel, other conductive metal, electrically conductive or magnetic plastic or other material with an electrically conductive surface. The sealing surface 28 may have a surface treatment such as plating, dipping, texturing, galvanizing, etc.

The contact rails 25 can be housed in the same or independent retaining member 15, wherein the contact rails 25 can be segmented into independent sections of various lengths, wherein shorter segments may be provided to help compensate for any flatness or other irregularities of the access panel 22. The width and depth of the retaining member 15 can vary to facilitate manufacturing, assembly or performance. The contact rails 25 can be plated or surface treated to improve the wear characteristics or shielding performance of the present invention.

A method of using the present invention may include the following. The radio frequency shield door system 100 disclosed above may be provided. A user may install the retaining members 15 along the perimeter frame 26 of a new or pre-existing exit, so that when the door or access panel 22 is in the closed configuration a RF or electromagnetic shield or barrier is sealed along the perimeter of the new or retro-fitted exit, thereby RF shielding the room or enclosure communicating to said exit.

The force exerted by each contact rail is perpendicular to the sealing surface 28 and thus the access panel 22. This greatly reduces the amount of force needed to close the door since there is no scrapping between the periphery 29 of the access panel and a biasing mechanism. This also eliminates all force required to move the access panel 22 to the open configuration since the spring loaded contact rails exerts an outward force in the direction of the open configuration when the access panel 22 is unlatched.

The radio frequency shield door system 100 enables easy operation with no complicated closing or opening mechanisms, because a standard door latch or commercial closing mechanism (not shown) can be used to maintain the closed configuration close, engaging the RF sealing mechanisms. Upon unlatching the door, the spring loaded rail pushes the access panel 22 to the open configuration with no operator effort required. It should be understood that RF shielding may include reduction of radio frequency, wireless, magnetic, electromagnetic, or acoustic signals or radiation from entering the controlled environment room or enclosure.

It should be understood, of course, that the foregoing relates to exemplary embodiments of the invention and that modifications may be made without departing from the spirit and scope of the invention as set forth in the following claims.

What is claimed is:

1. A system for providing electromagnetic shielding along a perimeter frame, comprising:
    an access panel pivotally connected to the perimeter frame so as to be movable between an open configuration and a closed configuration electromagnetically sealing a periphery of the perimeter frame;
    at least one contact rail connected along the periphery of the perimeter frame so as to be biased in an expanded condition and movable between the expanded condition and a compressed condition,
    wherein the at least one contact rail and the access panel comprise electrically conductive or magnetic material;
    a sealing surface provided along the access panel so as to align with the at least one contact rail in the closed configuration, wherein the sealing surface is electrically conductive or magnetic material; and
    a groove for receiving a portion of each of the at least one contact rail, wherein each groove is provided along the sealing surface.

2. The system of claim 1, further comprising:
    at least one retaining member connected along the periphery of the perimeter frame, each retaining member extending from a first end and a second end, wherein each retaining member comprises:
    a cavity between the first end and the second end; and
    an opening in the second end communicating to the cavity, wherein the opening is dimensioned so that each respective contact rail of the at least one contact rail snugly protrudes therethrough in the expanded condition; and
    a biasing mechanism housed in each cavity, wherein the biasing mechanism urges each respective contact rail of the at least one contact rail in the expanded condition.

3. The system of claim 2, wherein the biasing mechanism comprises a compression spring.

4. The system of claim 2, wherein each contact rail of the at least one contact rail extends from a first portion to a second portion, wherein each biasing mechanism engages the respective first portion, and wherein each opening is dimensioned to snugly interface with the respective second portion.

5. The system of claim 4, further comprising a bias rod interconnecting the biasing mechanism and the first portion within each cavity.

6. The system of claim 5, wherein each first portion provides an angled distal surface for engaging the respective bias rod.

7. The system of claim 6, wherein the at least one contact rail comprises two contact rails per cavity, and wherein the respective angled distal surfaces of said two contact rails are in a mirror orientation relative to each other.

8. The system of claim 1, wherein the sealing surface is inward of a periphery of an access door.

9. A system for providing electromagnetic shielding along a perimeter frame, comprising:
    an access panel pivotally connected to the perimeter frame so as to be movable between an open configuration and a closed configuration electromagnetically sealing a periphery of the perimeter frame;
    at least one retaining member connected along the periphery of the perimeter frame, each retaining member extending from a first end and a second end of electrically conductive or magnetic material, wherein each retaining member comprises:
    a cavity between the first end and the second end;
    at least one opening in the second end communicating to the cavity;
    at least one contact rail, wherein each contact rail extends from a first portion to a second portion; and
    a biasing mechanism housed in each cavity, wherein the biasing mechanism engages the first portion so as to urge the second portion to protrude through an adjacent opening of the at least one opening in the expanded condition and be movable between the expanded condition and a compressed condition; and
    a sealing surface of electrically conductive or magnetic material provided along and inward of a periphery of the access panel so as to align with the at least one opening in the closed configuration.

10. The system of claim 9, further comprising a groove for receiving a distal portion of each second portion, wherein each groove is provided along the sealing surface.

11. The system of claim 9, further comprising a bias rod interconnecting the biasing mechanism and the first portion within each cavity.

12. The system of claim 11, wherein each first portion provides an angled distal surface for engaging the respective bias rod.

13. The system of claim 12, wherein the at least one contact rail comprises two contact rails per cavity, and wherein the respective angled distal surfaces of said two contact rails are in a mirror orientation relative to each other.

\* \* \* \* \*